(12) United States Patent
Smythe, III et al.

(10) Patent No.: US 7,622,769 B2
(45) Date of Patent: Nov. 24, 2009

(54) ISOLATION TRENCH

(75) Inventors: John A. Smythe, III, Boise, ID (US);
Jigish D. Trivedi, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 166 days.

(21) Appl. No.: 11/497,665

(22) Filed: Aug. 1, 2006

(65) Prior Publication Data

US 2006/0267131 A1    Nov. 30, 2006

Related U.S. Application Data

(62) Division of application No. 10/782,997, filed on Feb. 19, 2004, now Pat. No. 7,112,513.

(51) Int. Cl.
H01L 29/76    (2006.01)
H01L 29/94    (2006.01)
H01L 31/062   (2006.01)
H01L 31/113   (2006.01)
H01L 31/119   (2006.01)

(52) U.S. Cl. .............. 257/330; 257/331; 257/328; 257/329; 257/E21.54; 257/E21.43; 438/424; 438/431

(58) Field of Classification Search .......... 257/524, 257/330, 331, 328, 329, E21.54, E21.43, 257/E21.431; 438/424, 436, 431
See application file for complete search history.

(56) References Cited

U.S. PATENT DOCUMENTS

| | | | |
|---|---|---|---|
| 4,855,804 A | 8/1989 | Bergami et al. | |
| 5,087,586 A | 2/1992 | Chan et al. | |
| 5,190,889 A | 3/1993 | Poon et al. | |
| 5,387,540 A | 2/1995 | Poon et al. | |
| 5,447,884 A | 9/1995 | Fahey et al. | |
| 5,492,858 A | 2/1996 | Bose et al. | |
| 5,702,976 A | 12/1997 | Schuegraf et al. | |
| 5,869,384 A | 2/1999 | Yu et al. | |
| 5,926,717 A | 7/1999 | Michael et al. | |
| 5,943,585 A | 8/1999 | May et al. | |
| 6,027,982 A | 2/2000 | Peidous et al. | |
| 6,037,238 A | 3/2000 | Chang et al. | |
| 6,046,487 A | 4/2000 | Benedict et al. | |
| 6,180,490 B1 * | 1/2001 | Vassiliev et al. | 438/424 |

(Continued)

OTHER PUBLICATIONS

Advertisement entitled "Polysilazane SODs Spinfil™ 400 Series for STI/PMD Application."

(Continued)

*Primary Examiner*—Walter L Lindsay, Jr.
*Assistant Examiner*—Telly D Green
(74) *Attorney, Agent, or Firm*—Knobbe Martens Olson & Bear LLP

(57) ABSTRACT

A method of depositing dielectric material into sub-micron spaces and resultant structures is provided. After a trench is etched in the surface of a wafer, an oxygen barrier is deposited into the trench. An expandable, oxidizable liner, preferably amorphous silicon, is then deposited. The trench is then filled with a spin-on dielectric (SOD) material. A densification process is then applied, whereby the SOD material contracts and the oxidizable liner expands. Preferably, the temperature is ramped up while oxidizing during at least part of the densification process. The resulting trench has a negligible vertical wet etch rate gradient and a negligible recess at the top of the trench.

10 Claims, 6 Drawing Sheets

U.S. PATENT DOCUMENTS

| | | |
|---|---|---|
| 6,187,651 B1 | 2/2001 | Oh |
| 6,316,331 B1 | 11/2001 | Tseng |
| 6,461,937 B1 | 10/2002 | Kim et al. |
| 6,500,726 B2 | 12/2002 | Lee et al. |
| 6,518,148 B1 | 2/2003 | Cheng et al. |
| 6,576,558 B1 | 6/2003 | Lin et al. |
| 6,657,276 B1 | 12/2003 | Karlsson et al. |
| 6,699,799 B2 * | 3/2004 | Ahn et al. .................. 438/781 |
| 6,717,231 B2 | 4/2004 | Kim et al. |
| 6,956,276 B2 | 10/2005 | Hokazono |
| 7,176,104 B1 | 2/2007 | Chen et al. |
| 7,271,463 B2 | 9/2007 | Smythe, III et al. |
| 2002/0022326 A1 | 2/2002 | Kunikiyo |
| 2002/0064937 A1 | 5/2002 | Kim et al. |
| 2003/0022522 A1 | 1/2003 | Nishiyama et al. |
| 2004/0099928 A1 | 5/2004 | Nunan et al. |

OTHER PUBLICATIONS

Peters, Laura, "Choices and challenges for shallow trench Isolation," Semiconductor International, Website www.ree-electronics.com, Apr. 1, 1999, 6 pages.

* cited by examiner

ISOLATION TRENCH

CROSS-REFERENCE TO RELATED APPLICATIONS

This application is a divisional of U.S. patent application Ser. No. 10/782,997, filed Feb. 19, 2004, now U.S. Pat. No. 7,112,513 entitled "SUB-MICRON SPACE LINER AND DENSIFICATION PROCESS," which is entirely incorporated herein by reference. This application is also related to U.S. patent application Ser. No. 10/925,715, filed Aug. 24, 2004, and Ser. No. 11/009,665, filed Dec. 4, 2004.

BACKGROUND OF THE INVENTION

1. Field of the Invention

This invention relates generally to the field of integrated circuit fabrication, and more specifically to the deposition and processing of spin-on dielectric materials.

2. Description of the Related Art

Integrated circuit manufacturers increasingly face difficulties with scaling. According to Moore's Law, the number of transistors per unit of area grows exponentially. For this to continue, several major changes in semiconductor manufacturing are expected. Transistors are not the only devices that must get smaller on an integrated circuit. Even though packing transistors closer is important, they must still be electrically separated from each other. One method of keeping transistors separate from each other is known as trench isolation. Trench isolation is the practice of creating trenches in the substrate in order to separate electrical components on the chip. The trenches are filled with an insulator that will prevent cross-talk between transistors.

Shallow Trench Isolation (STI) is becoming more prevalent in the design of integrated circuits. In STI, the trench width is becoming increasingly smaller with successive generations. The size can vary, but a trench less than a micron wide has become quite common. STI shrinks the area needed to isolate transistors from each other. STI also offers smaller channel width encroachment and better planarity than technologies used for larger process nodes.

STI trenches are typically filled with oxide, but how that is done varies. They can be filled by chemical vapor deposition (CVD), such as high-density plasma chemical vapor deposition (HDP CVD) using tetraethyl orthosilicate (TEOS) as a precursor with or without ozone. However, filling these trenches with oxide gets more challenging as the width of the trenches gets smaller and aspect ratios thus increase. CVD deposits the material from the outside of the trench inwards, leading to pinching at the upper corners. This leads to problems such as the creation of voids, areas where the filler does not accumulate, or to seams where the growth from the sides of the edges meets. Such seams can create inconsistencies in subsequent processing, such as planarization or other etch steps. HDP CVD methods can also result in undesired erosion of underlying features.

Another major method for filling isolation trenches is known as spin-on deposition. Spin-on deposition entails dripping a liquid precursor onto the wafer surface in a predetermined amount. The wafer is subjected to rapid spinning (e.g., up to 6000 rpm). The spinning uniformly distributes the liquid on the surface by centrifugal forces. The liquid fills low points and automatically planarizes the surface. Finally, the coating is baked in order to solidify the material. While spin-on can be more expensive and difficult to implement, it is seen as the long-range solution for the deposition of dielectric materials because of its ability to fill with no seam, void, or erosion problems.

However, there have been many problems with the implementation of trench-fill systems. For the spin-on system, one of these problems has been achieving acceptable bulk density in sub-micron STI trenches. There are some methods of achieving density in these sub-micron spaces, including the use of electron-beam and steam oxidation curing. However, available methods do not provide a full solution to the problems faced in this arena. For example, the inventors have found that known methods of densification can lead to material that is too vulnerable to recess at the top of the trench during polishing and wet cleans. Thus, the available solutions do not fully address the problems related to this area.

SUMMARY OF THE INVENTION

In accordance with one aspect of the invention, a method is provided for creating a shallow trench comprises etching a trench on a wafer. The method comprises depositing a liner on surfaces of the trench, filling the trench with a dielectric material, and densifying the dielectric material with a process that will cause the liner to expand.

In another aspect of the invention, a method of densifying liquid dielectric material begins with curing a substrate in a curing chamber in a steam ambient environment. While the substrate is in the chamber, the temperature of the chamber is ramped up to a target temperature. The substrate is then annealed at a temperature within a range of the target temperature.

In another aspect of the invention, a amorphous silicon layer lines a trench. The trench is filled with a dielectric filler. The liner is then expanded while the filler is contracted.

In another aspect of the invention, an amorphous silicon layer lines a trench. The trench is filled with a dielectric filler. The liner is then expanded while the filler is contracted.

BRIEF DESCRIPTION OF THE DRAWINGS

These and other aspects of the invention will be better understood from the Detailed Description of the Preferred Embodiments and from the appended drawings, which are meant to illustrate and not to limit the invention, and wherein.

DETAILED DESCRIPTION OF THE PREFERRED EMBODIMENT

Bulk density of spin-on dielectric (SOD) materials can be achieved in sub-micron spaces, such as isolation trenches, through the use of a liner material that expands irreversibly when oxidized. In the illustrated embodiments described below, after a trench is formed, the sidewalls of the trench are oxidized, and a nitride layer is deposited to protect the active area of the trench. An expandable liner is deposited over the nitride liner before the trench is filled with a dielectric material. When the dielectric material is densified, the liner expands. The dielectric material reduces in size significantly as the material is densified. The expanding liner serves to evenly compress the dielectric material. In this manner, the combination of the liner and the densification process yields excellent bulk density in sub-micron spaces.

The liner material is preferably easily deposited in small spaces and irreversibly expanded when oxidized. In a preferred embodiment, the liner is amorphous silicon. As amorphous silicon oxidizes into silicon oxide, it expands. Other materials that expand upon oxidation, such as polysilicon, could also be used.

The densification of the materials within sub-micron spaces is also helpful to the proper filling of the space. In a preferred embodiment, the wafer is cured in a steam chamber. While the wafer is in the chamber, the temperature is increased. After the temperature reaches the target, the wafer anneal continues at a temperature plateau. The densification process has the benefit of densifying the spin-on material sufficiently without damaging any of the surrounding materials. A beneficial result of this densification process is the matching of wet etch resistance in small and large features.

In order to attain better bulk density in small spaces, such as spaces smaller than a micron in width, improvements are made to the process of depositing these materials. Spin-on deposition is preferably used in order to avoid creating a seam in the deposited material. The skilled artisan, however, will readily find application for the principles and advantages taught herein to the use of other filler materials within trenches in a variety of fabrication contexts.

Creating the Sub-micron Space

Figure 1:
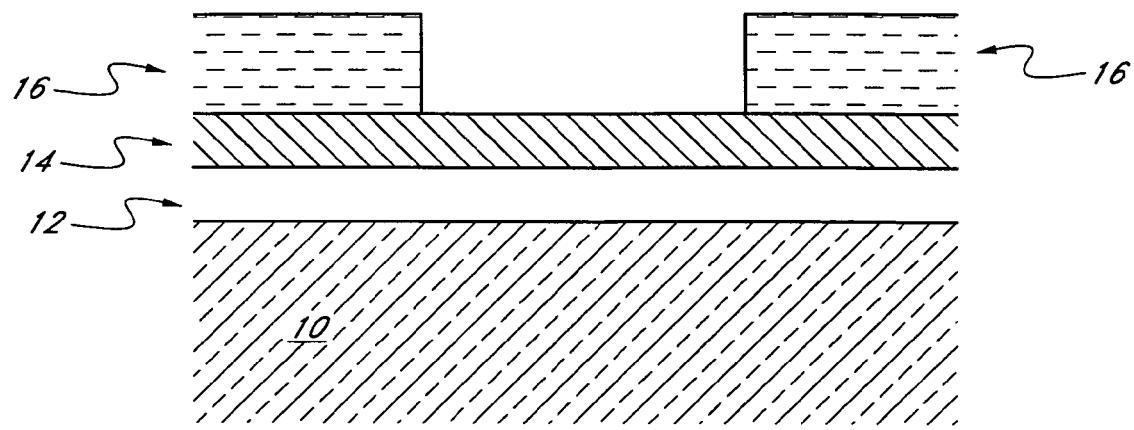
FIG. 1 is a schematic, cross-sectional side view of the substrate with a thin "pad oxide" grown over the surface of the substrate, a thicker layer of silicon nitride ($Si_3N_4$), and a photoresist mask in accordance with a starting point for preferred embodiments of the present invention.

An introductory step is the creation of a sub-micron space, such as a trench for shallow trench isolation (STI). As shown in FIG. 1, a semiconductor substrate 10, e.g., a silicon wafer, is provided and a thin "pad" oxide 12 is thermally grown on the substrate. Afterward a thick layer of a silicon nitride 14, preferably $Si_3N_4$, is formed. The nitride 14 is preferably formed by chemical vapor deposition (CVD). This nitride layer 14 acts as a stop for the chemical mechanical polishing (CMP) process. Exemplary thickness ranges are between about 30 Å and 100 Å for the pad oxide 12 and between about 200 Å and 1500 Å for the nitride layer 14.

Figure 2:
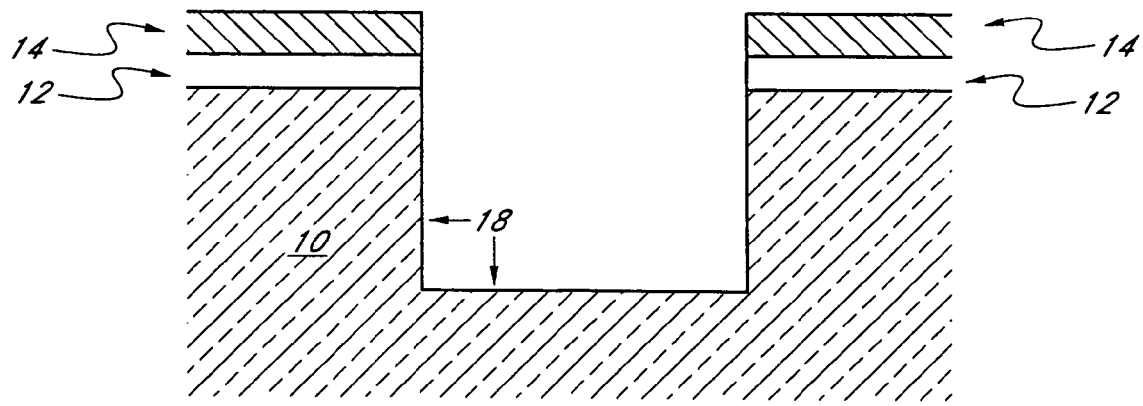
FIG. 2 is a schematic, cross-sectional side view of the substrate of FIG. 1 after a trench has been formed with a reactive ion etch (RIE).

As shown in FIG. 1, a photoresist mask 16 is applied to the substrate 10 in order to etch the trench. Photoresist is applied on the surface of the wafer. A reticle that blocks ultraviolet (UV) radiation is then placed over the wafer. The photoresist is then selectively exposed to UV radiation. Depending upon whether positive or negative resist is employed, the developing solution washes away either exposed or unexposed regions. After the trench is etched, the photoresist mask 16 of FIG. 2 is removed by conventional resist strip process.

Figure 3:
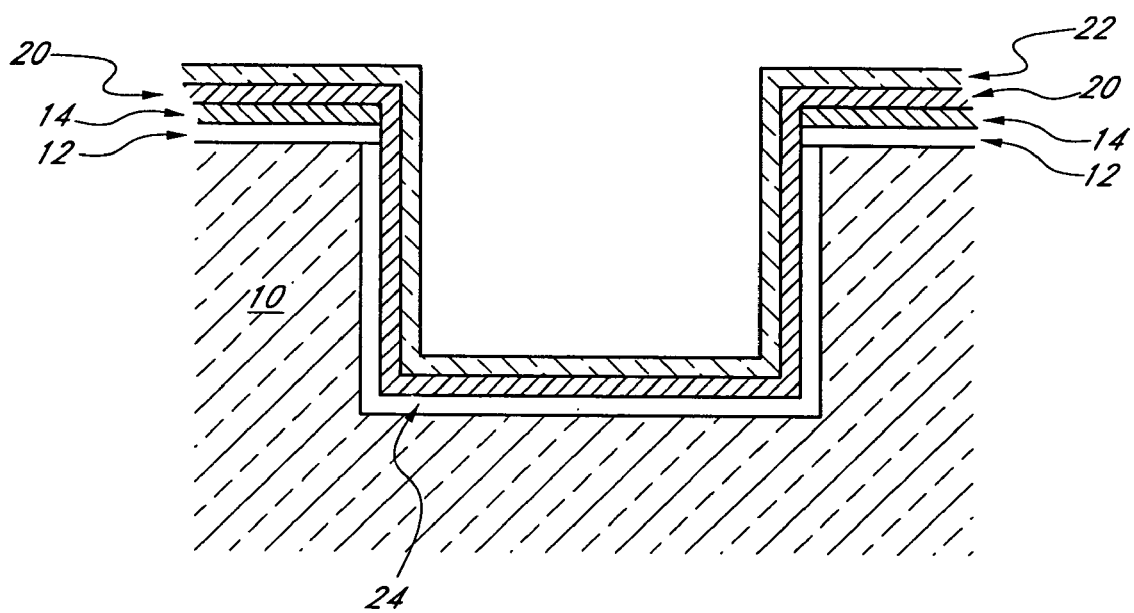
FIG. 3 is a schematic, cross-sectional side view of the substrate of FIG. 2 with thin oxide, nitride, and amorphous silicon layers lining the trench.

A trench can be etched in two primary ways, isotropically or anisotropically. The anisotropic method is directional and produces relatively straight, vertical sidewalls. One type of anisotropic etch is known as reactive ion etch (RIE). As shown in FIG. 2, this method is quite accurate and straight; however, it damages sidewalls 18 of the trench, which define edges of transistor active areas. As shown in FIG. 3, the sidewalls 18 are preferably oxidized, forming a thin oxide layer 24, in order to repair the damage from the prior RIE.

Filling the Trench

In order to protect the active areas adjacent to the trench from subsequent processing, an insulating oxygen barrier, in the illustrated embodiment comprising another nitride layer 20, is deposited in the trench, preferably by CVD. This layer can range in thickness of preferably between about 10 angstroms (Å) and 300 Å, more preferably between about 20 Å and 200 Å, and most preferably between about 30 Å and 150 Å. The nitride layer 20 both protects the active area and acts as an oxygen barrier between the semiconductor layer and the filler materials.

As shown in FIG. 3, a thin expandable liner layer 22 is formed in the trench. This liner layer 22 can be formed in several ways, but the layer is preferably deposited using CVD. The liner material preferably expands during a densification process described below. In a preferred embodiment, the liner preferably comprises amorphous silicon with a thickness of between about 20 Å and 200 Å, more preferably between 25 Å and 150 Å, most preferably between 50 Å and 100 Å. Preferably, the liner is completely oxidized during the densification process described below. Because amorphous silicon is easy to apply using CVD and expands relatively uniformly upon oxidation, it makes an excellent liner layer 22. Additionally, amorphous silicon makes a high quality oxide when oxidized.

Figure 4:
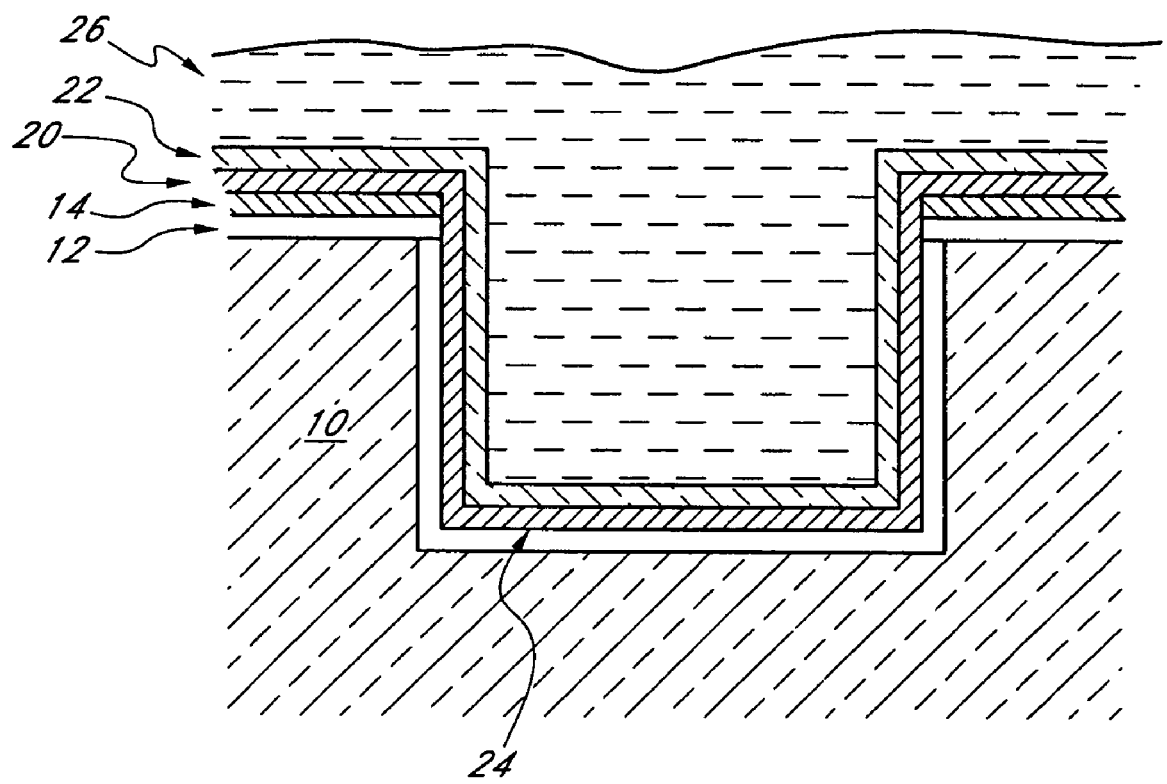
FIG. 4 is a schematic, cross-sectional side view of the substrate of FIG. 3 with a layer of spin-on dielectric material filling the trench.

A spin-on deposition process is preferably used to deposit a dielectric material 26 into the remaining space in the trench, as shown in FIG. 4. The thickness of this layer 26 will vary based upon the size of the trench, but in the illustrated embodiment the thickness of the material is preferably between 2500 Å and 5500 Å, more preferably between 3000 Å and 4500 Å. Spin-on deposition uses liquid materials placed on a wafer. The wafer is then rapidly spun, which spreads the liquid uniformly over the surface of the wafer after filling the low points on the wafer. An example of a spin-on material is Spinfil™ made by Clariant (Japan) K.K.—Life Science & Electronic Chemicals of Tokyo, Japan. However, the skilled practitioner will appreciate that many dielectric materials can be used for these purposes.

Other processes, such as TEOS CVD, can also be used to fill the trench. While filling by CVD would not yield the best possible results, the amorphous silicon liner could also be beneficial for this process. The amorphous silicon liner would expand upon oxidation, compressing the TEOS filler. Skilled practitioners will appreciate that several deposition processes could be used to fill the trench.

Densification Process

The densification process recommended by Clariant, the manufacturer of the spin-on dielectric (SOD) material, was found unsatisfactory for the purposes of such small spaces. Clariant's Spinfil™ SOD material, based upon perhydrosilazane ($SiH_2NH$), has a recommended baking recipe as follows:

1) 3 min of hot plate baking at 150° C.,
2) 30 min at 700-800° C. in steam ambient
3) Annealing for STI at 800-1000° C. in dry oxygen.

However, this process was found problematic for trenches that are very small, particularly where trenches of a variety of widths across the substrate are to be filled. With this process, during the subsequent etchings, CMP, and wet cleans, the trench-fill material has been found to recess too much. Also, the wet etch rates and density of the material within the trench after the densification was not consistent from the top to the bottom as in larger features. A new process was needed in order to correct the problems. The process preferably densities the material enough so that it does not recess excessively when being planarized, etched, or wet cleaned. This preference must also be balanced by the need for the densification process to be mild enough to avoid oxidizing the nitride layer in addition to the SOD material and the amorphous silicon layer. If the nitride layer is oxidized, the semiconductor sidewalls that define the edges of transistor active areas could also be subsequently oxidized, thereby consuming critical transistor real estate. Also, preferably, the materials within the trench should not significantly shrink away from the walls much.

Figure 8:
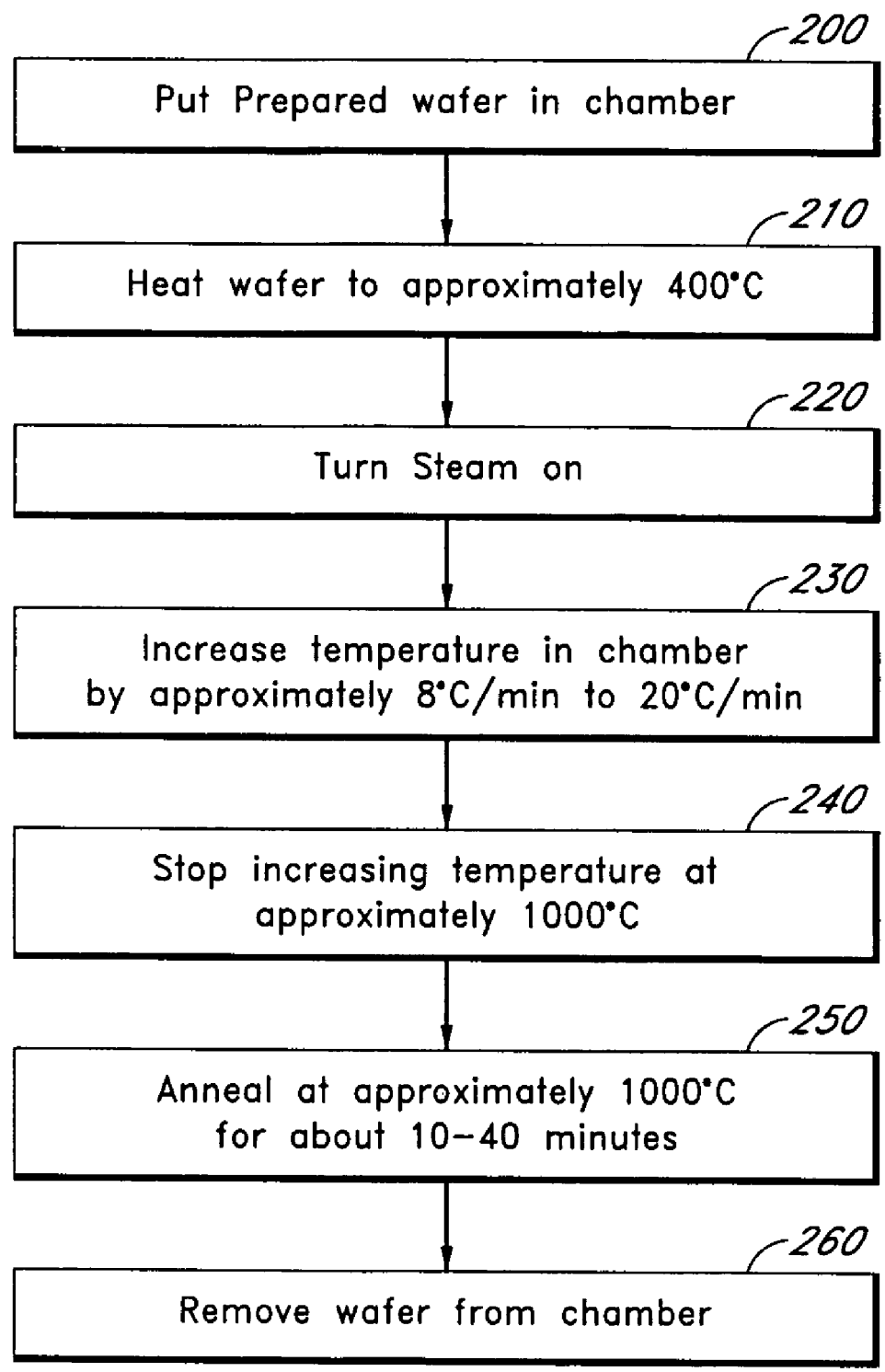
FIG. 8 is a flow chart of a process for densification of spin-on dielectric in accordance with the preferred embodiment of the present invention.

A preferred embodiment of a densification process is shown in flow chart form in FIG. 8. Preferably, 200 a prepared wafer is placed in a chamber. The wafer is preferably heated 210 to an initial temperature of between about 200° C. and 600° C., more preferably between 300° C. and 500° C., most preferably between 350° C. and 450° C. in the chamber. Preferably, steam is then turned on 220 in the chamber. From the initial temperature, the heat ramps 230 up to a target temperature between approximately 800° C. and 1200° C., more preferably between 900° C. and 1100° C., and most preferably between 950° C. and 1050° C. The increase of the temperature in the chamber is stopped 240 when it gets to this target temperature. The temperature can increase approximately between about 3° C. per minute to 25° C. per minute, more preferably between about 8° C. and 20° C. During the escalation of the temperature, the wafer is in an oxidizing environment, preferably an ambient steam environment. After the temperature is ramped up, the wafer is annealed 250 for approximately 10 to 40 minutes, more preferably between 15 min and 35 min, at the temperature plateau on steady state. In the preferred embodiment, the wafer is annealed in a second oxidizing environment, preferably in a dry oxygen ($O_2$) environment. Finally, after the process is done, the wafer is removed 260 from the chamber.

In this process the steam reacts with the polysilizane on the heated substrate. As the temperature rises, the reaction begins to increase the rate of oxidation. The chemical reaction associated with the densifying process of the preferred spin-on dielectric, polysilizane, is shown below:

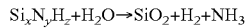
$$Si_xN_yH_z + H_2O \rightarrow SiO_2 + H_2 + NH_3$$

Figure 5:
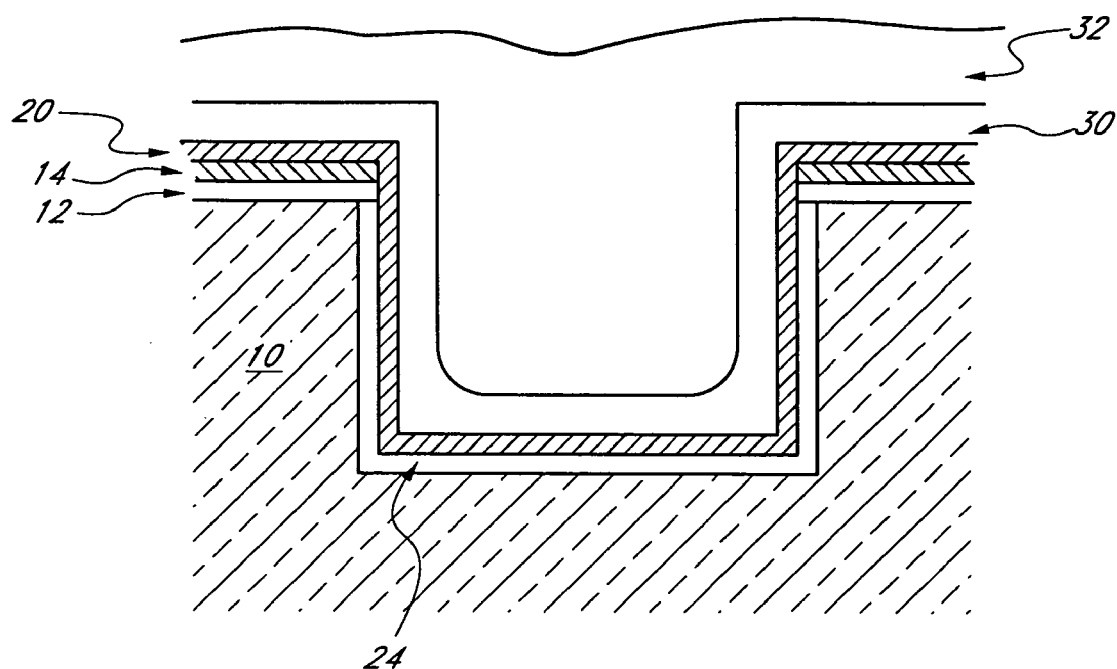
FIG. 5 is a schematic, cross-sectional side view of the substrate of FIG. 4 after a curing and densification process.

FIG. 5 shows the trench and surrounding area after the densification process. During the densification process, a linear volume decrease of preferably about 7% to 25%, or more preferably between about 12% and 18%, takes place. In other words, the volume of the spin-on dielectric material will shrink linearly by approximately 15% as it turns into a layer of silicon oxide 32. In the preferred embodiment, the process will oxidize both the SOD material and the amorphous silicon liner. As the SOD material oxidizes and shrinks, the preferred amorphous silicon layer will expand as it turns into a layer of liner silicon oxide 30. If the thickness of the amorphous silicon layer is selected properly, the entirety of the layer will be consumed during the oxidation. The nitride liner 20 below the liner will not be oxidized because the oxidation process is not that aggressive, and furthermore the liner 20 preferably getters excess oxidant. Both the SOD material and the liner will become forms of silicon oxide in the densification process. However, the filler silicon oxide 32 that was the SOD material may etch faster than the liner silicon oxide 30 that was the amorphous silicon liner.

The expandable liner 22 of FIG. 4 serves to compress the dielectric material evenly. The liner's functions include compressing the dielectric materials evenly and acting as a getter of oxygen for the dielectric material during the densification process. As the preferred amorphous silicon layer 22 is oxidized, it expands uniformly from its position along the sidewalls of the trench, evenly compressing the dielectric material. This reinforces the constant wet etch rate in each of the sections of silicon oxide from the top of the trench to the bottom of the trench.

Structure

Figure 6:
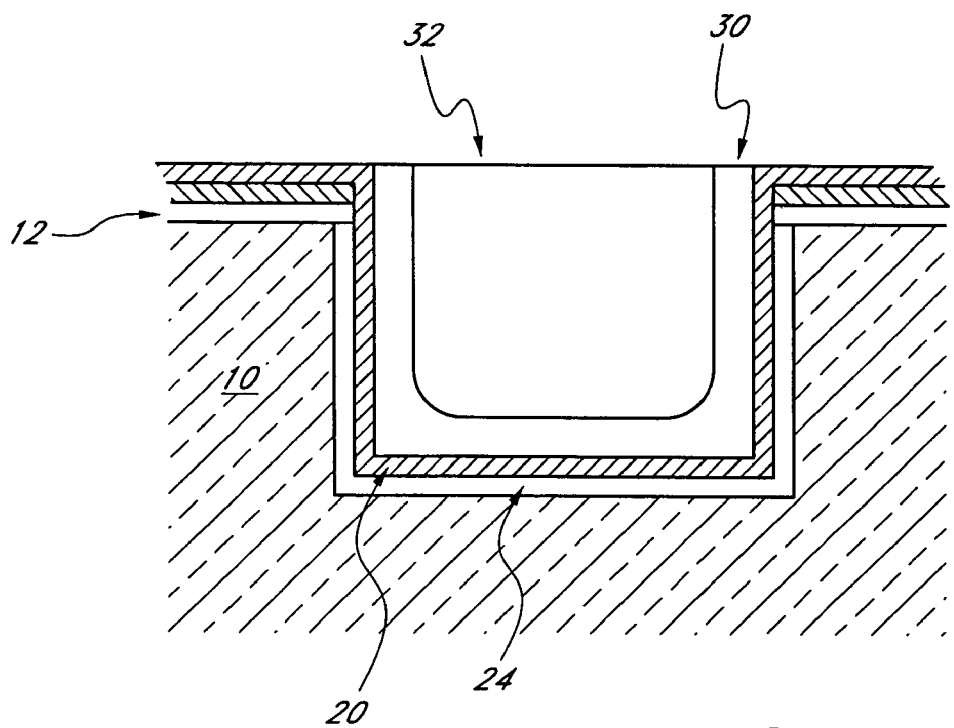
FIG. 6 is a schematic, cross-sectional side view of the substrate of FIG. 5 after chemical mechanical polishing (CMP) the oxide down to the top nitride surface.

As shown in FIG. 6, a CMP or other etchback process can be used to remove undesired materials on top of the wafer. The consistent and slow etch rates in the layers of silicon oxide 30, 32 substantially reduces any recess formed at the top of the trench. The nitride layer 20 in the trench remains in the trench after the densification process to protect the active areas adjacent to the trench.

When used in combination, the liner and the densification process yield two silicon oxide layers that have a neglible vertical wet etch rate gradient. In other words, the wet etch rate is substantially consistent from the top to the bottom of the trench in each of the layer. Typically, a narrower trench will have a bigger gradient. However, this was not the case for the preferred process described above when both the amorphous silicon liner and the densification process were used. The even compression by the liner creates substantial uniformity of wet etch rate gradients in the densified dielectric material from trench to trench, even when one trench is significantly narrower. For example, a trench with a width of w will have a substantially similar wet etch rate gradient in the filler silicon oxide 32 as a trench with a width of 3 w, 5 w, or even 10 w. In a preferred embodiment, the vertical etch rate gradient of two trenches of widths varying by an order of magnitude is within 5%, more preferably within 2%. This consistency is helpful when performing etches, CMPs, and wet cleans across an entire wafer.

Additionally, because the SOD system is used, the filler material does not have a seam as would result if the trench were filled using CVD process such as ozone TEOS. This avoids problems with subsequent processing, including planarizations and etches.

FIG. 6 shows the structure after the process is completed and the wafer has been through etching and a wet clean. It can be seen that there a substantially reduced recess on the top of the shallow trench. The nitride liner 20 is not oxidized beneath the silicon oxide. There are two identifiable layers of silicon oxide in the trench. The first, thinner liner oxide layer 30 is a thermal oxide formed from the amorphous silicon liner. The second filler oxide layer 32 is the thicker layer of silicon oxide, which is a spin-on dielectric. It typically has a higher wet etch rate than that of the thermal oxide in small features.

Figure 7:
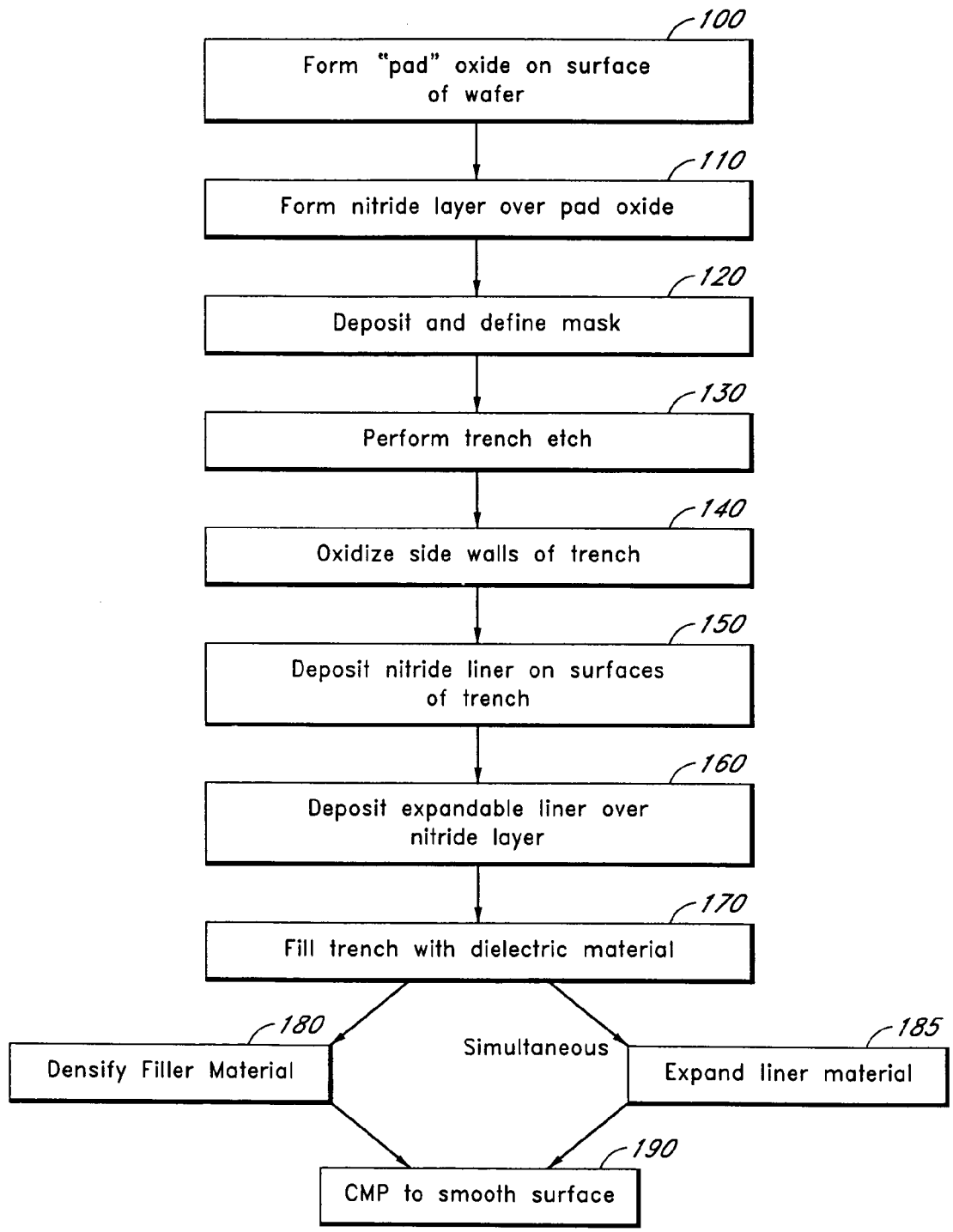
FIG. 7 is a flow chart of a process for shallow trench isolation in accordance with the preferred embodiment.

If the liner 22 is used without the improved densification process or the densification process is used without the liner 22, benefits are still obtained. The problems of wet etch rate gradient and recessing at the top of the trench will still be less than that if neither improvement were used. In a preferred embodiment shown in FIG. 7, both of these improvements are used in order to maximize the benefit gained from the improvements.

It will be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. An isolation trench structure, comprising:
   a first trench and an adjacent second trench, where the second trench is at least five times wider than the first trench;
   a nitride liner on surfaces of the trenches; and
   a filler layer of silicon oxide filling the trenches, wherein the filler layer of silicon oxide has a substantially consistent and substantially same vertical wet etch rate in both of the first and second trenches.

2. The trench of claim 1, wherein the second trench is at least 10 times wider than the first trench.

3. The trench of claim 1, wherein the nitride liner is between about 10 Å and 200 Å thick.

4. The trench of claim 1, wherein the filler layer is a spin-on dielectric.

5. The trench of claim 1, wherein the filler layer is a seamless silicon oxide.

6. A shallow trench isolation structure for an integrated circuit, comprising:
   a barrier layer lining a trench in semiconductor material; and
   a silicon oxide based filler material filling the trench lined by the barrier layer wherein:
   the silicon oxide based filler material has a substantially consistent vertical wet etch rate;
   the trench has a first width and the silicon oxide based filler material in the trench has a first vertical wet etch rate gradient; and
   an adjacent trench has a second width and the silicon oxide based filler material in the adjacent trench has a second vertical wet etch rate gradient, the second width being at least 10 times greater than the first width and the first wet etch rate gradient being within 5% of the second wet etch rate gradient.

7. The structure of claim 6, wherein the filler material comprises a spin-on dielectric.

8. The structure of claim 6, wherein the first wet etch rate gradient is within 2% of the second wet etch rate gradient.

9. An isolation trench for an integrated circuit, comprising a filler layer of silicon oxide filling the trench, wherein:
   the filler layer has a substantially consistent vertical wet etch rate;
   the trench has a first width and the filler layer of silicon oxide in the trench has a first vertical wet etch rate gradient; and
   a neighboring trench has a second width and a filler layer of silicon oxide in the neighboring trench has a second vertical wet etch rate gradient, the second width being at least 10 times greater than the first width and the first wet etch rate gradient being within 5% of the second wet etch rate gradient.

10. The trench of claim 9, wherein the filler layer is a spin-on dielectric.

* * * * *